US008947967B2

(12) United States Patent
Dreesen et al.

(10) Patent No.: US 8,947,967 B2
(45) Date of Patent: Feb. 3, 2015

(54) SHARED INTEGRATED SLEEP MODE REGULATOR FOR SRAM MEMORY

(71) Applicant: Advanced Micro Devices Inc., Sunnyvale, CA (US)

(72) Inventors: Michael Dreesen, Timnath, CO (US); Stephen Greenwood, Fort Collins, CO (US); Bruce Doyle, Longmont, CO (US)

(73) Assignee: Advanced Micro Devices Inc., Sunnyvale, CA (US)

(*) Notice: Subject to any disclaimer, the term of this patent is extended or adjusted under 35 U.S.C. 154(b) by 221 days.

(21) Appl. No.: 13/725,385

(22) Filed: Dec. 21, 2012

(65) Prior Publication Data

US 2014/0177349 A1 Jun. 26, 2014

(51) Int. Cl.
*G11C 5/14* (2006.01)
*G11C 7/00* (2006.01)

(52) U.S. Cl.
CPC .......... *G11C 5/14* (2013.01); *G11C 2207/2227* (2013.01)
USPC ....... 365/227; 365/226; 365/203; 365/189.09

(58) Field of Classification Search
CPC .. G11C 5/14; G11C 16/30; G11C 2207/2227; G11C 11/413; G11C 13/0038
USPC .............. 365/227, 226, 203, 194, 189.05, 365/189.09, 229, 185.18
See application file for complete search history.

(56) References Cited

U.S. PATENT DOCUMENTS

| | | | |
|---|---|---|---|
| 2006/0152966 A1* | 7/2006 | Park | 365/154 |
| 2006/0262610 A1* | 11/2006 | Khellah et al. | 365/189.09 |
| 2007/0147159 A1* | 6/2007 | Lee | 365/227 |
| 2007/0189086 A1* | 8/2007 | Choi et al. | 365/194 |
| 2008/0186794 A1* | 8/2008 | Clinton | 365/227 |
| 2009/0129192 A1* | 5/2009 | Barth et al. | 365/226 |
| 2013/0083613 A1* | 4/2013 | Phan et al. | 365/203 |

* cited by examiner

*Primary Examiner* — J. H. Hur
*Assistant Examiner* — Ajay Ojha
(74) *Attorney, Agent, or Firm* — Staniford Tomita LLP

(57) ABSTRACT

Embodiments are described for a method for regulating sleep mode of a plurality of sub-banks in an SRAM array by isolating all of the sub-banks from a regulator upon access to at least one sub-bank that causes the accessed sub-bank to go to an operating voltage, and isolating the accessed sub-bank from non accessed sub-banks, while maintaining a sleep voltage on a load memory array and each of the sub-banks through the regulator; comparing a voltage on the non accessed sub-banks to a voltage output of the regulator; and providing a sleep voltage level to all of the sub-banks through the regulator when the voltage on the non accessed sub-banks is less than the sleep voltage.

20 Claims, 4 Drawing Sheets

400

```
┌─────────────────────────────────────┐
│ REGULATOR PROVIDES BIAS VOLTAGE TO  │
│     LOAD AND SRAM SUB-BANKS         │
│                402                  │
└─────────────────────────────────────┘
                  ↓
┌─────────────────────────────────────┐
│ DETECT ACCESS TO A SUB-BANK WITHIN  │
│            SRAM ARRAY               │
│                404                  │
└─────────────────────────────────────┘
                  ↓
┌─────────────────────────────────────┐
│ ISOLATE ALL SUB-BANKS OF ARRAY FROM │
│             REGULATOR               │
│                406                  │
└─────────────────────────────────────┘
                  ↓
┌─────────────────────────────────────┐
│ ISOLATE ACCESSED SUB-BANKS FROM NON-│
│  ACCESSED SUB-BANKS OF SRAM ARRAY   │
│                408                  │
└─────────────────────────────────────┘
                  ↓
┌─────────────────────────────────────┐
│  COMPARE SUB-BANK VOLTAGE LEVEL TO  │
│       ARRAY STANDBY VOLTAGE         │
│                410                  │
└─────────────────────────────────────┘
                  ↓
┌─────────────────────────────────────┐
│   CLOSE FEEDBACK SWITCH WHEN VDDA   │
│  DROPS BELOW Vsleep TO BRING ALL SUB-│
│   BANKS BACK TO REGULATION LOOP     │
│                412                  │
└─────────────────────────────────────┘
```

FIG. 4

SHARED INTEGRATED SLEEP MODE REGULATOR FOR SRAM MEMORY

TECHNICAL FIELD

One or more implementations relate generally to semiconductor memory arrays, and more specifically to sleep mode regulators for SRAM memory circuits.

BACKGROUND

The bitcells of static random access memory (SRAM) devices consume leakage power even when not in use. This leakage or 'standby' power is often a large component of the total power consumption in modern system-on-chip (SoC) devices that feature densely packed devices of various types, since such devices often include a significant amount of onboard SRAM. Various efficiency techniques, such as SRAM sleep modes have been developed as a viable solution to reduce SRAM standby power consumption. Such techniques can be either passive or active, with active control generally offering superior power savings and more reliable array stand-by voltage ($V_{sleep}$) than passive control.

Various techniques have been developed to control sleep modes in SRAM devices and reduce the standby power consumed by these devices. One example sleep mode method that is currently used interrupts the memory voltage regulator during a memory access, thus driving the bias of the output device and the input to the regulator to supply rails. This disturbance places the VDDA level above the bitcell retention voltage after an access while the voltage regulator output returns to the targeted level. In such present systems, the regulator amplifier must slew its output back to the proper bias point after an access operation, and at least one amplifier is required for every section of the memory array that is to be independently revived. This means that at least one regulator amplifier must be provided for every sub-array or independent portion of the SRAM memory. This present solution tightly constrains the design of the array and amplifier, and requires the usage of a significant amount of space and power.

In general, SRAM array sleep regulators need to track only temperature-induced leakage changes, and so they can have a low slew rate for low standby current. Sustained SRAM wake operations with elevated VDDA, however, may supply charges to VDDA faster than they leak away, thus lowering the regulator output current. When operations cease and VDDA drops rapidly, the regulator is unable to keep up, resulting in VDDA undershoot and a threat to SRAM data retention. Using bypass capacitance to mitigate this problem is possible, but is generally not feasible due to the large area needed.

The subject matter discussed in the background section should not be assumed to be prior art merely as a result of its mention in the background section. Similarly, a problem mentioned in the background section or associated with the subject matter of the background section should not be assumed to have been previously recognized in the prior art. The subject matter in the background section merely represents different approaches.

SUMMARY OF EMBODIMENTS

Some embodiments are described for a method for regulating sleep mode of a plurality of sub-banks in an SRAM array, comprising: isolating all of the sub-banks from a regulator upon access to at least one that causes the accessed sub-bank to go to an operating voltage, and isolating the accessed sub-bank from non accessed sub-banks, while maintaining a sleep voltage on a load memory array and each of the sub-banks through the regulator; comparing a voltage on the non accessed sub-banks to a voltage output of the regulator; and providing a sleep voltage level to all of the sub-banks through the regulator when the voltage on the non accessed sub-banks is less than the sleep voltage.

Some embodiments are directed to a method of transitioning an accessed SRAM sub-bank to a sleep voltage level after an access operation performed with the SRAM sub-bank at an operating voltage level comprising: opening a feedback loop maintained by a regulator providing the sleep voltage to an SRAM array containing the SRAM sub-bank; opening the feedback loop upon execution of the access operation to allow the accessed SRAM sub-bank to go to the operating voltage level; isolating the accessed SRAM sub-bank from one or more other SRAM sub-banks upon execution of the access operation; and closing the feedback loop upon completion of the access operation to allow the accessed SRAM sub-bank to return to the sleep voltage level.

Some embodiments are directed to an apparatus or system comprising one or more processing elements that perform the acts or process steps of the two methods described above.

BRIEF DESCRIPTION OF THE DRAWINGS

In the following drawings like reference numbers are used to refer to like elements. Although the following figures depict various examples, the one or more implementations are not limited to the examples depicted in the figures.

FIG. 4 is a flow diagram illustrating a method of regulating voltage levels for SRAM sleep mode, under some embodiments.

DETAILED DESCRIPTION

Embodiments are generally directed to a voltage regulator circuit embedded within an SRAM array that provides a minimum amount of leakage current to the bitcells of the array to enable bitcells that are not being accessed to maintain data. The regulator keeps non-accessed bitcells at a lower (sleep) voltage than is required for operation, but at a high enough level to ensure data retention in the bitcell. Embodiments are also directed to a device and method for maintaining the regulator state during a memory access, which minimizes regulator charge delivery while allowing for regulator sharing between arrays and enabling fine-grained sleep sub-banks within the SRAM array.

Any of the embodiments described herein may be used alone or together with one another in any combination. The one or more implementations encompassed within this specification may also include embodiments that are only partially mentioned or alluded to or are not mentioned or alluded to at all in this description or in the abstract. Although various embodiments may have been motivated by various deficiencies with the prior art, which may be discussed or alluded to in one or more places in the specification, the embodiments do not necessarily address any of these deficiencies. In other words, different embodiments may address different deficiencies that may be discussed in the specification. Some embodiments may only partially address some deficiencies or just one deficiency that may be discussed in the specification, and some embodiments may not address any of these deficiencies.

SRAM sleep mode lowers the voltage on the SRAM bitcells when they are not in use. The sleep mode voltage, referred to as $V_{sleep}$, is much lower than the SRAM bitcell operating voltage VDD, but is at a high enough level to allows the bitcells to retain data. A memory access operation on a particular SRAM array will put the bitcells of the array from $V_{sleep}$ to the operating voltage VDD level. When switching between sleep and active modes, the bitcells of an idle SRAM array will transition to and from the respective voltage levels for sleep mode and operating (active or wake) mode through a voltage regulator. In general, voltage regulators are not particularly fast devices, since they are designed for stability instead of speed. Embodiments are directed to a method and system of transitioning SRAM arrays from wake mode to sleep mode in a manner that eliminates voltage fluctuations or undershoot conditions that might destabilize the memory and cause increased access times and power consumption. Some embodiments are directed to a circuit that regulates the voltage at which the bitcells sleep ($V_{sleep}$), and allows a single amplifier to be shared among one or more SRAM units (e.g., arrays, sub-arrays, banks, sub-banks, etc.), while keeping the inactive arrays at $V_{sleep}$ with minimal undershoot as an array switches back to $V_{sleep}$ after being in active or wake mode.

Figure 1:
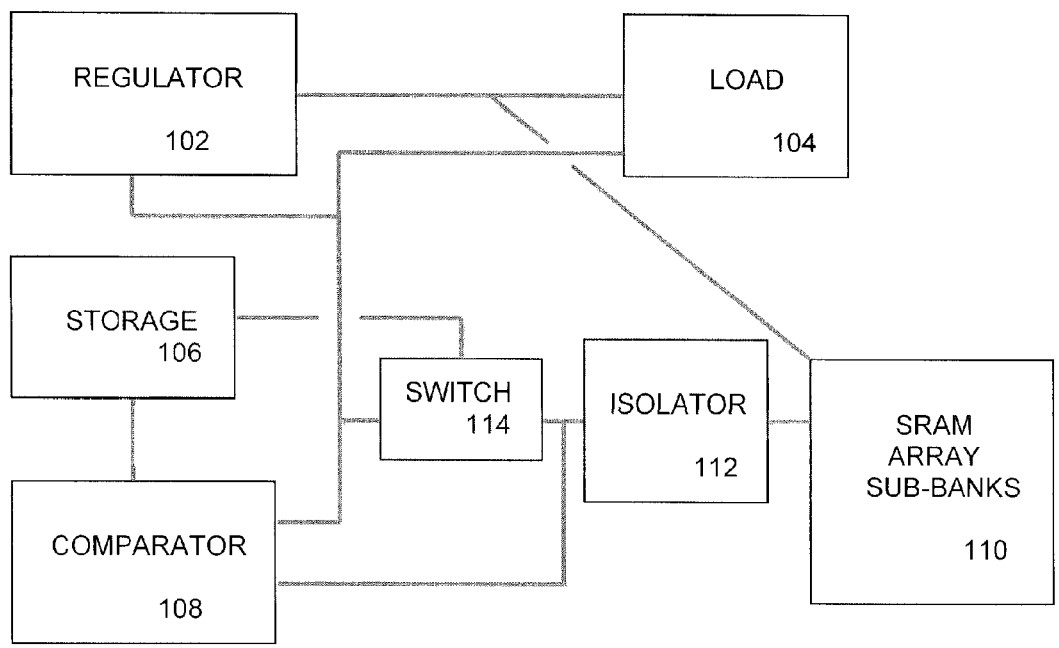
FIG. 1 is a block diagram of a shared integrated regulator device for SRAM sleep mode, under some embodiments.

FIG. 1 is a block diagram of a shared integrated regulator device for SRAM sleep mode, under some embodiments. As shown in diagram 100, a single voltage regulator 102 is used to keep one or more SRAM sub-banks 112 at a voltage, $V_{sleep}$, which is a voltage level that is below the SRAM access voltage VDD. A load 104 is also held at the $V_{sleep}$ level by the regulator 102. In some embodiments, the load may be implemented through a replica of an SRAM array, and may be referred to as a 'slave array', although other load circuits are also possible. In parallel with the regulator output, each SRAM sub-bank (non-slave SRAM array 110) has a 'wake' device that can pull the SRAM voltage from $V_{sleep}$ to VDD. Each SRAM sub-bank 110 has one or more isolation devices 112 such that other SRAM sub-banks or arrays are not disturbed when any one sub-bank 110 is in wake mode and accessed at VDD. One isolator 112 may be provided for each SRAM sub-bank 112, or a single isolator containing an array of switches may be provided for all of the SRAM sub-banks 112, with one switch per sub-bank. Each SRAM sub-bank 110 may be an arbitrary portion of an entire SRAM memory, and may represent an array, sub-array, bank, block, or other portion of a total amount of SRAM in a device or integrated circuit (IC). Any appropriate number of sub-banks may be present in system 100, such as 16 sub-banks within an SRAM array, for example. In general, the sub-banks should be of the same size and circuit layout, but they may also be of different sizes and layouts.

Through the load 104, the regulator 102 provides a constant output voltage, which is not interrupted regardless of which SRAM sub-bank 110 is active at any point in time. During an access, the voltage of the accessed sub-bank is at VDD, while the other arrays are at held at the $V_{sleep}$ level. Prior to an access, all sub-banks are isolated from the regulator through a switch 114. Thus, the regulator 102 is essentially unaware that a particular SRAM sub-bank is being accessed. After the access, the accessed array goes from VDD to $V_{sleep}$. The load 104 keeps the regulator output near that desired to keep the SRAM at $V_{sleep}$, so that it does not slew towards VDD and supply insufficient current to sub-banks that are not being accessed. After an access, a comparator 108 determines whether or not the voltage on all sub-banks 110 falls below the $V_{sleep}$ level. If so a switch 114 is flipped and the regulator regulates the entire SRAM array (e.g., of 16 sub-banks) as it did before the accessed sub-bank was accessed. In some embodiments, the switch 114 is activated/deactivated through a control signal that triggers a wake mode (e.g., SubBankWake signal) of the SRAM devices.

The system 100 also has an isolator 112 between the active sub-bank and all other SRAM sub-banks 110 such that when the active sub-bank is put at VDD it does not disturb non-active sub-banks. This isolation is removed immediately following access to a sub-bank, through the control signal. Prior to being put into active or wake mode, the sub-bank to be accessed is isolated from the other sub-banks through an isolator 112.

A storage element 106, which may be implemented as SR (set-reset) latch, or similar component captures and stores the output of the comparator 108. As shown, the storage 106 may be a separate standalone element, but it could also integrated or built into the comparator 108. The regulator 102 is isolated from the elevated VDD level and receives feedback from the load 104 during accesses to the active SRAM array, thus keeping undershoot low.

The system 100 may be operated in two modes, open loop and closed loop. In open loop operation, feedback from the slave array sets the regulator output current. For closed loop operation, when an SRAM sub-bank access happens the isolator 112 between the regulator feedback and the other SRAM sub-banks 110 is disabled. This switch 114 is controlled by the output of the storage 106, which is reset to disable the switch. One or more SRAM sub-banks are pulled to VDD for an access. After the access, the device holding the array to VDD is disabled and the voltage falls toward $V_{sleep}$. When the voltage of the accessed SRAM sub-bank falls below the output of the regulator, the comparator trips and resets the latch, closing the feedback switch 114.

Figure 2:
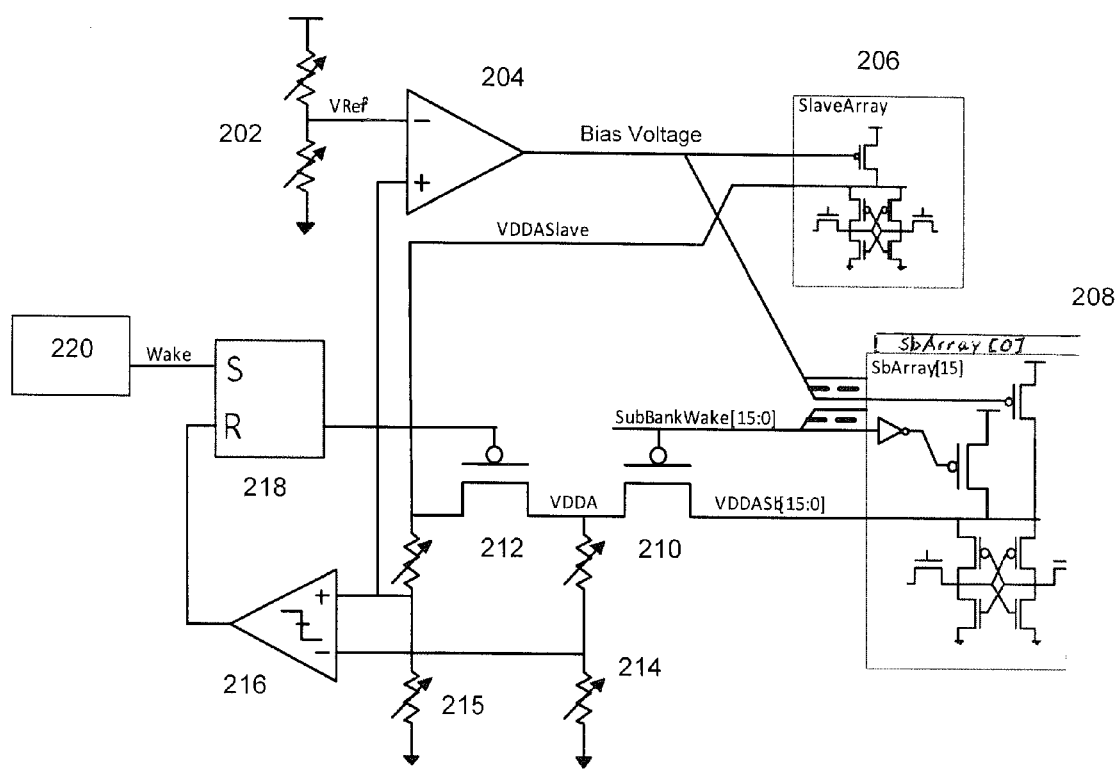
FIG. 2 is an example circuit diagram implementing the shared integrated regulator device of FIG. 1, under some embodiments.

FIG. 2 is an example circuit diagram 200 implementing the shared integrated regulator device of FIG. 1, under some embodiments. Circuit 200 includes a plurality of SRAM sub-banks 208. The example of FIG. 2 illustrates 16 sub-bank arrays denoted SbArray[0]-SbArray[15]. Each sub-bank is a portion of the entire SRAM and is an SRAM array or a portion of an SRAM array. In an example implementation, the size of each SRAM sub-bank may be on the order of 64 rows of bitcells by 72×8 columns, or any other appropriate size. The transition from active state (VDD) to sleep ($V_{sleep}$) is regulated by a regulator circuit that is coupled to a load that is implemented in some embodiments as a slave SRAM array (SlaveArray) 206. The regulator (e.g., regulator 102) comprises an input amplifier 204 and input transistors for the slave array 206 and each of the SRAM sub-banks 208. The slave array may be any appropriately sized memory circuit. In one implementation the slave array is the same bitcell type as a sub-bank and is a fraction of the size of a sub-bank, such as on the order of one-eighth the size of an SRAM sub-bank.

A voltage divider 202 generates an input reference voltage $V_{Ref}$ from a voltage source, such as an external voltage source or a bandgap reference voltage, and generates a bias voltage that is input to the amplifier 204. The amplifier 204 outputs a bias voltage to both the slave array 206 and each of the SRAM sub-banks 208. The bias voltage controls a current source transistor that provides leakage current to each of the SRAM sub-banks even when a sub-bank may be cutoff from the rest of the circuit. The regulator, comprised of the amplifier 204 and the current source transistors within the slave array 206 and SRAM sub-bank 208, generates a desired sleep voltage $V_{sleep}$ based on the $V_{Ref}$ level. This voltage is applied to the VDDA node of the slave array, denoted VDDASlave in diagram 200. The voltage on each individual sub-bank is denoted VDDASb[15:0] for the sixteen individual sub-banks shown in FIG. 2. When an SRAM sub-bank is active or in wake mode VDDASb is at VDD, and when it is in sleep mode, VDDASb is at $V_{sleep}$.

A feedback loop from the SRAM sub-banks 208 traverses through a pair of FET (field effect transistor) devices 210 and 212 through comparator 216 and SR latch 218, though other types of switching devices or components may be used. The FET device 210 isolates each sub-bank from every other sub-bank in the array 208 based on the state of a respective sub-bank wake signal denoted SubBankWake[15:0]. When the SubBankWake signal goes high for a particular sub-bank, that sub-bank is put into an active state for execution of an access operation (memory read or write). In a typical implementation, only one sub-bank is active at any one time, however any number of sub-banks may be active at any one time. FET device 212 isolates all SRAM sub-banks 208 from the regulator stage. The voltage level of the node between the two FET devices 210 and 212 is called VDDA, while the output of FET device 212 is called VDDASlave. The resistor chain 214 coupled to the VDDA node sets the gain of the regulator feedback loop. In one example implementation sets $V_{Ref}$ at one-half of VDD based on the ratio of the resistors in chain 214.

The two FET devices 210 and 212 provide VDDA and VDDASlave to the inputs of a comparator 216. An enable signal to the comparator enables the comparator 216 when a sub-bank wake signal is high, and disables the comparator when no wake signal is high. The comparator output is coupled to an SR latch 218. The set input of the SR latch 281 is coupled to a combinatorial logic 220, which combines the sub-bank wake signals in a logical OR circuit.

The comparator compares the VDDA level to the VDDASlave level and is configured to output a high signal when VDDA falls below the VDDASlave level. When the comparator 216 output goes high, it resets the SR latch 218, which opens the FET device 212. This closes the feedback loop and the SRAM sub-banks are set regulated and brought to $V_{sleep}$. In this manner, a dropping VDDA level is seen by amplifier 204 and adjusts the level to bring VDDA up to the desired Vsleep level corresponding to the VDDASlave level. As long as the VDDA level is greater than VDDASlave level the feedback loop is open and all the SRAM sub-banks are isolated from the regulator.

In some embodiments, the regulator has a current-mirror load differential amplifier input stage 204 and a PFET output device. The design is Miller-compensated using the parasitic capacitance in the routes between the output PFET bias signal and the feedback signal. The regulator output PFET width is programmable for both the SRAM sub-banks and the slave array, independently, to either globally change the width of the device or create an offset between slave array current and sub-bank currents, if desired. The input stage is designed to operate at low voltage and tight common-mode input range. The regulator and the comparator, which is used to trigger the opening of feedback switches 210 and 212, are designed to have very low DC offsets. The nearly temperature-independent reference voltage, generated by a ratio of high-R poly resistors 214, sets the common-mode input point, and $V_{sleep}$ is programmed using resistive feedback to set the linear gain of the amplifier.

The regulator system of FIGS. 1 and 2 operates so that prior to waking, all SRAM sub-banks are first removed from the feedback network of the regulator 102 by an isolator 112 to avoid a disturbance within the circuit and the regulator. The output of the regulator 102 still drives current into all SRAM sub-banks 110, but the regulator 102 is not receiving feedback from them. Any accessed (waking) sub-banks are then isolated from others before their VDDA levels are pulled to VDD to minimize charge use. The only load in the regulator's feedback network during an access is the load (slave SRAM array). The comparator 108 may have as inputs resistively-divided scaled versions of VDDA and VDDASlave voltage levels. Alternatively, it may directly compare the VDDA and VDDASlave nodes.

At the end of the access cycle, devices holding the sub-banks' VDDA to VDD are turned off, the isolation between the sub-banks is removed, and charge is shared onto the other sub-banks that are not in the feedback network of the regulator 102. The comparator 108 is then released from the pre-set state. When the VDDA voltage drops below VDDASlave and trips the comparator, all feedback switches are closed, and the sub-banks are brought back into the regulation loop asynchronously with respect to the SRAM pipeline. The greatly decreased VDDA slew rate allows the low-bandwidth regulator 102 to drive VDDA to $V_{sleep}$ with very low undershoot.

Figure 3:
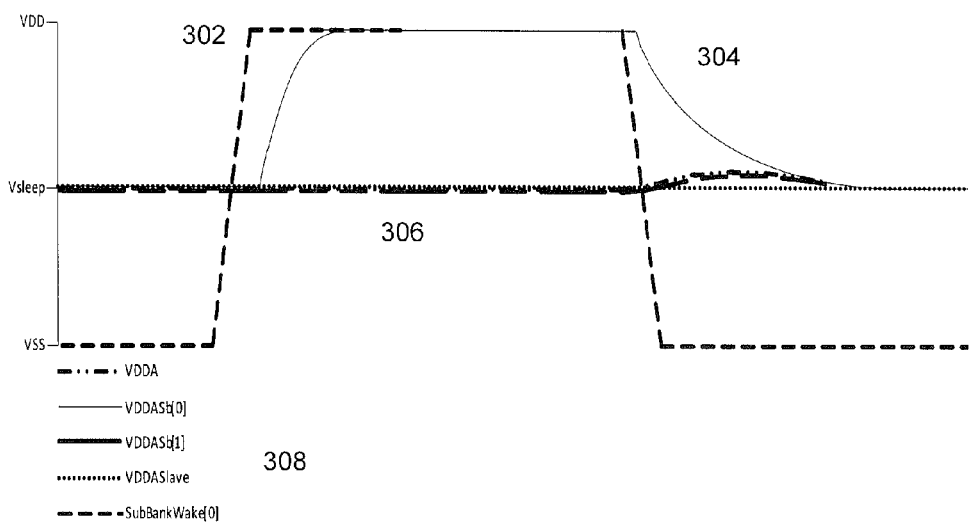
FIG. 3 is a waveform diagram illustrating a wake event and a return to sleep state for an SRAM memory array utilizing a shared integrated regulator, under some embodiments.

FIG. 3 is a waveform diagram illustrating a wake event and a return to sleep state for an SRAM memory array utilizing a shared integrated regulator, under some embodiments. Diagram 300 illustrates the voltage levels of various signals relative to a constant $V_{sleep}$ level and a maximum active voltage level VDD and a ground (lowest) voltage level VSS. For FIG. 3, the legend 308 illustrates various different voltage waveforms for each of the possible voltages during operation of the shared integrated regulator, and in which: $V_{sleep}$ represents that desired voltage for an array when it is not being accessed; VDD is the positive supply voltage (highest voltage in the system); VSS is the negative supply voltage (lowest voltage in the system); VDDA is the voltage that happens to be on the array at any given time; and VDDSb[n] is the name of the node in the circuit that is the voltage supply to the SRAM array.

The example of FIG. 3 illustrates a case where a single sub-bank (sub-bank 0) is accessed while the other sub-banks remain in sleep mode. As shown in diagram 300, a wake signal for the accessed sub-bank (SubBankWake[0]) signal 302 isolates the accessed sub-bank and pulls it up to VDD and during this period sub-bank 0 can be accessed for a read or write operation. For the example shown in FIG. 3, the sub-bank 0 voltage gets pulled up VDDSb[0], while the other arrays VDDSb[1]-[15] and VDDASlave get held at the $V_{sleep}$ voltage level. The SubBankWake[0] signal drops back to VSS upon completion of the access cycle, at which point the VDDASb[0] signal level drops to the $V_{sleep}$ level. As shown in FIG. 3, this transition is represented as smooth curve that drops from VDD to $V_{sleep}$ within a certain period of time after the SubBankWake[0] signal ramps down. This time period is typically significantly shorter than the ramp down time experienced by other sleep regulator systems and does not exhibit the undershoot that is also experienced in these other systems.

As shown in diagram 300, after the access of sub-bank 0 is complete, which occurs when the SubBankWake[0] signal goes to VSS, some charge from sub-bank 0 goes to the other sub-banks (VDDASb[1]) and the VDDA level goes up slightly as well. This is shown as the slight bump in voltage level for these signals after the SubBankWake[0] signal goes past the $V_{sleep}$ voltage level. With regard to circuit operation, at this point where the voltage on all sub-banks is less than $V_{sleep}$, the comparator 108 trips and clears the storage (latch) 106.

FIG. 4 is a flow diagram illustrating a method of regulating an SRAM memory array, under some embodiments. As shown in process 200, the regulator provides bias voltage to the load (e.g., slave array 206), act 402. The system then detects an access to a sub-bank within the SRAM array, act 404. Upon an access to a sub-bank the feedback loop opens to isolate the subbanks of the array from the regulator, act 406. The sub-bank or sub-banks that are accessed are then isolated from the non-accessed sub-banks, act 408. The VDDA nodes of sub-banks to be accessed are pulled to VDD. After an access, active sub-banks' VDDA node are released from VDD, falling towards Vsleep. In act 410 the comparator compares the sub-bank voltage level (VDD) to the array standby voltage (VDDA), act 410. The latch circuit closes the feedback switch when VDDA drops below $V_{sleep}$ to bring all the sub-banks back to the regulation loop, act 412.

The shared regulator scheme increases the flexibility of sub-bank design, easing integration of sleep mode into any SRAM design. The sub-banks can be sized arbitrarily based on the needs of the memory pipeline because each sub-bank does not have the overhead of needing its own regulator. Sub-banks can be small such that wake time is less than address-decode time, although wake device sizes must meet the dynamic current needs of writing a word. In some embodiments, this design uses sub-banks that contain 64 or 65 rows, depending on whether the sub-bank has a redundant row. The current consumption due to a sub-bank wake is comparable to that of the bitline pre-charge, which generally does not pose a significant design challenge. VDDA needs the lowest capacitance possible for wake time, regulation loop stability, and dynamic power. The bodies of the bitcell PFETs are tied to VDD to keep VDDA capacitance low, which has the added benefit of a larger body bias when the SRAM is at $V_{sleep}$, reducing leakage current.

In an example implementation, the regulator circuit of FIG. 2, can be integrated into an SRAM macro that has a logical organization of, for example eight SRAM sub-banks with 16 columns and 516 rows per I/O. In this example case, the regulator is shared by 16 physical sub-banks. The SRAM design is clock-less to reduce clock mesh power. The macro pipeline uses two memory clock cycles per access, one for the access and one for signal transit. At least one and up to two (during burst-read) physical sub-banks are awakened in the first phase of the access, with VDDA pulled from $V_{sleep}$ to full VDD in awakened sub-banks. It should be noted that this is one example of a possible implementation architecture, and the SRAM sleep regulator method disclosed herein can be used with various different SRAM configurations and devices.

The disclosed system provides the following advantages: it allows smaller sections of the memory array to be woken up independently of the other sections, saving dynamic power and having a lower in-rush current; it allows a single amplifier to be used with many SRAM arrays, saving standby power and silicon area; and it maintains the proper bias on the regulator output device, minimizing the charge delivered by the regulator to the SRAM arrays.

For purposes of the present description, the terms "component," "module," "circuit," and "process," may be used interchangeably to refer to a circuit element or processing unit that performs a particular function. Such a function may be implemented purely in hardware or it may be implemented through computer program code (software), digital or analog circuitry, computer firmware, or any combination thereof It should be noted that the various functions disclosed herein may be described using any number of combinations of hardware, firmware, and/or as data and/or instructions embodied in various machine-readable or computer-readable media, in terms of their behavioral, register transfer, logic component, and/or other characteristics. Computer-readable media in which such formatted data and/or instructions may be embodied include, but are not limited to, physical (non-transitory), non-volatile storage media in various forms, such as optical, magnetic or semiconductor storage media. Under some embodiments, the computer readable media may store program code or software instructions that are executed by a computer system and cause the computer system to perform at least some of the functions and processes of a method 400 of providing SRAM regulation as shown in FIG. 4.

Some embodiments are also directed to computer readable media comprising a data structure that is operated upon by a program executable on a computer system. The program operates on the data structure to perform a portion of a process to fabricate an integrated circuit including circuitry described by the data structure. The circuitry described in the data structure includes: a regulator configured to provide a bias voltage to an input stage of a load memory array and each of the sub-banks of the plurality of sub-banks through a regulator that is coupled to the SRAM array through a feedback loop upon an access to at least one accessed sub-bank of the plurality of sub-banks that causes the accessed sub-bank to go to an operating voltage, an isolator configured to isolate the accessed sub-bank from the non-accessed sub-banks of the plurality of sub-banks during the access to the accessed sub-bank, a comparator configured to compare a voltage on all sub-banks to a voltage output of the regulator, and a switch configured to close the feedback loop to provide a sleep voltage level to all of the sub-banks through the regulator.

Unless the context clearly requires otherwise, throughout the description and the claims, the words "comprise," "comprising," and the like are to be construed in an inclusive sense as opposed to an exclusive or exhaustive sense; that is to say, in a sense of "including, but not limited to." Words using the singular or plural number also include the plural or singular number respectively. Additionally, the words "herein," "hereunder," "above," "below," and words of similar import refer to this application as a whole and not to any particular portions of this application. When the word "or" is used in reference to a list of two or more items, that word covers all of the following interpretations of the word: any of the items in the list, all of the items in the list and any combination of the items in the list.

While one or more implementations have been described by way of example and in terms of the specific embodiments, it is to be understood that one or more implementations are not limited to the disclosed embodiments. To the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A method for regulating sleep mode of a plurality of sub-banks in an SRAM array, comprising:
   isolating, during an access to at least one sub-bank of the plurality of sub-banks that causes the accessed sub-bank to go to an operating voltage, all of the sub-banks from a regulator and isolating the accessed sub-bank from the non-accessed sub-banks while maintaining a sleep voltage on a load memory array and each of the sub-banks through the regulator;
   comparing a voltage on all sub-banks to a voltage output of the regulator; and providing a sleep voltage level to all of the sub-banks through the regulator when the voltage on the non-accessed sub-banks is less than the sleep voltage.

2. The method of claim 1 further wherein the regulator comprises a single operational amplifier device coupled to the load memory array and each of the plurality of sub-banks.

3. The method of claim 1 further comprising performing the step of comparing in a comparator component coupled to a first node set at the sleep voltage and second node set at the voltage on all sub-banks.

4. The method of claim 3 further comprising storing an output of the comparator in a latch device coupled to the comparator.

5. The method of claim 4 wherein the latch device comprises a set-reset (SR) latch.

6. The method of claim 4 wherein a feedback loop is provided to perform isolation of the sub-banks from the regulator and the accessed sub-bank from the non-accessed sub-banks.

7. The method of claim 6 wherein closing the feedback loop is performed by a transistor switch circuit in the feedback loop, and further wherein the transistor switch circuit comprises a first transistor isolating the sub-banks from the regulator and a second transistor isolating the accessed sub-bank from the non accessed sub-banks.

8. The method of claim 1 further comprising generating the sleep voltage by performing a voltage divider operation on a reference supply voltage input through an input amplifier stage coupled to the load memory array.

9. The method of claim 8 wherein the load memory array comprises a scaled version of a sub-bank of the plurality of sub-banks.

10. A method of transitioning an accessed SRAM sub-bank to a sleep voltage level after an access operation performed on the accessed SRAM sub-bank at an operating voltage level comprising:
opening a feedback loop maintained by a regulator providing the sleep voltage to an SRAM array containing the accessed SRAM sub-bank and a plurality of additional SRAM sub-banks;
opening the feedback loop upon execution of the access operation to allow the accessed SRAM sub-bank to go to the operating voltage level;
isolating the accessed SRAM sub-bank from the additional SRAM sub-banks upon execution of the access operation; and
closing the feedback loop upon completion of the access operation to allow the accessed SRAM sub-bank to return to the sleep voltage level.

11. The method of claim 10 further comprising providing the sleep voltage as a constant bias voltage to each additional sub-bank the SRAM array and a slave SRAM array coupled to the regulator as a load.

12. The method of claim 11 wherein the regulator comprises a single operational amplifier device coupled to each sub-bank of the SRAM array and the slave SRAM array.

13. The method of claim 12 wherein the slave SRAM array is configured to prevent the regulator from ramping from the operating voltage to the sleep voltage during the access operation performed on the accessed SRAM sub-bank.

14. A circuit comprising:
a regulator configured to provide a bias voltage to an input stage of a load memory array and each of the sub-banks of the plurality of sub-banks through a regulator that is coupled to the SRAM array through a feedback loop upon an access to at least one accessed sub-bank of the plurality of sub-banks that causes the accessed sub-bank to go to an operating voltage;
an isolator configured to isolate the accessed sub-bank from the non-accessed sub-banks of the plurality of sub-banks during the access to the accessed sub-bank;
a comparator configured to compare a voltage on all sub-banks to a voltage output of the regulator; and
a switch configured to close the feedback loop to provide a sleep voltage level to all of the sub-banks through the regulator.

15. The circuit of claim 14 further wherein the regulator comprises a single operational amplifier device coupled to the load memory array and each of the plurality of sub-banks.

16. The circuit of claim 15 further comprising a latch storing an output of the comparator.

17. The circuit of claim 16 wherein the isolator comprises a first transistor isolating the sub-banks from the regulator and a second transistor isolating the accessed sub-bank from the non accessed sub-banks.

18. The circuit of claim 17 wherein the switch comprises a functional portion of the latch at the first transistor.

19. The circuit of claim 17 further comprising an input stage including a voltage divider dividing a reference supply voltage input through an input amplifier stage coupled to the load memory array.

20. The circuit of claim 14 wherein the load memory array comprises a scaled version of a sub-bank of the plurality of sub-banks.

* * * * *